United States Patent
Chen et al.

(10) Patent No.: US 12,111,582 B2
(45) Date of Patent: *Oct. 8, 2024

(54) SUBSTRATE STAGE AND SUBSTRATE PROCESSING SYSTEM USING THE SAME

(71) Applicant: Taiwan Semiconductor Manufacturing Company, Ltd., Hsinchu (TW)

(72) Inventors: Yu-Huan Chen, Hsinchu (TW); Yu-Chih Huang, Hsinchu (TW); Ya-An Peng, Taoyuan (TW); Shang-Chieh Chien, New Taipei (TW); Li-Jui Chen, Hsinchu (TW); Heng-Hsin Liu, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/351,571

(22) Filed: Jul. 13, 2023

(65) Prior Publication Data

US 2023/0359133 A1    Nov. 9, 2023

Related U.S. Application Data

(63) Continuation of application No. 17/370,267, filed on Jul. 8, 2021, now Pat. No. 11,747,741.

(60) Provisional application No. 63/156,969, filed on Mar. 5, 2021.

(51) Int. Cl.
   *G03F 7/00*    (2006.01)

(52) U.S. Cl.
   CPC ...... *G03F 7/70725* (2013.01); *G03F 7/70758* (2013.01); *G03F 7/70775* (2013.01); *G03F 7/70358* (2013.01)

(58) Field of Classification Search
   CPC ............. G03F 7/70725; G03F 7/70758; G03F 7/70775; G03F 7/70358; G03F 7/70716; G03F 7/70866; G03F 7/7095; G03F 7/70991
   See application file for complete search history.

(56) References Cited

U.S. PATENT DOCUMENTS

| | | | |
|---|---|---|---|
| 9,256,139 B2 | 2/2016 | LaFarre et al. | |
| 10,078,275 B2 | 9/2018 | Okada | |
| 10,629,747 B2 * | 4/2020 | Gai | H01L 29/66757 |
| 11,747,741 B2 * | 9/2023 | Chen | G03F 7/70725 |
| | | | 414/749.2 |
| 2022/0331862 A1 | 10/2022 | LaFarre et al. | |

* cited by examiner

*Primary Examiner* — Hung V Nguyen
(74) *Attorney, Agent, or Firm* — McClure, Qualey & Rodack, LLP (57) ABSTRACT

A semiconductor substrate stage for carrying a substrate is provided. The semiconductor substrate stage includes a base layer, a magnetic shielding layer disposed on the base layer, a carrier layer disposed on the magnetic shielding layer, a receiver disposed on the carrier layer, a storage layer disposed between the base layer and the magnetic shielding layer, and a magnetic shielding element disposed on the carrier layer and surrounding the receiver.

20 Claims, 10 Drawing Sheets

FIG. 5B

SUBSTRATE STAGE AND SUBSTRATE PROCESSING SYSTEM USING THE SAME

PRIORITY CLAIM AND CROSS-REFERENCE

The present application is a Continuation of U.S. patent application Ser. No. 17/370,267, filed on Jul. 8, 2021, now U.S. Pat. No. 11,747,741, which claims priority of U.S. Provisional Patent Application No. 63/156,969, filed on Mar. 5, 2021, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering the associated costs. Such scaling down has also increased the complexity of IC processing and manufacturing.

For example, there is a growing need to perform higher-resolution lithography processes. One lithography technique is extreme ultraviolet lithography (EUVL). The EUVL technique employs scanners that use light in the extreme ultraviolet (EUV) region, having a wavelength of about 1-10 nm. Some EUV scanners provide 4 times reduction projection printing, similar to some optical scanners, except that the EUV scanners use reflective optics rather than refractive optics, i.e., mirrors instead of lenses.

A semiconductor substrate stage is used in the EUV scanners for carrying semiconductor substrate (e.g. a wafer) during the process. Although existing semiconductor substrate stage for transporting substrates in EUV scanners during the lithography process have been adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the minimum feature size of semiconductor integrated circuits (ICs) has continued to shrink, there has continued to be a great interest in photolithography systems and processes using radiation sources with shorter wavelengths. In view of this, extreme ultraviolet (EUV) radiation sources, processes, and systems have been introduced. In some EUV semiconductor substrate processing systems, a movable substrate stage is provided to carry a substrate (e.g. a wafer) to for exposure. The substrate stage is disposed on a magnetic plate without in contact with the magnetic plate, such as by a maglev manner. Therefore, the substrate stage is movable relative to the magnetic plate. During the lithography process, cables are connected to the substrate stage to transport stuff to the substrate stage, such as control signal, power, water, hydrogen, etc. However, particle may be released due to the friction of the cables with other parts, which reduces the yield.

Therefore, embodiments of a semiconductor substrate processing systems with reduced amount of cables are provided. For example, in some embodiments, the control signal may be provided to the substrate stage in a wireless manner, so particle generated during the process may be reduced to increase the yield. In some embodiments, a wireless receiver is provided on the substrate stage to receive the wireless control signals, and a magnetic shielding layer is provided to prevent magnetic interference occur to the wireless receiver (e.g. caused by the magnetic plate).

Figure 1A:
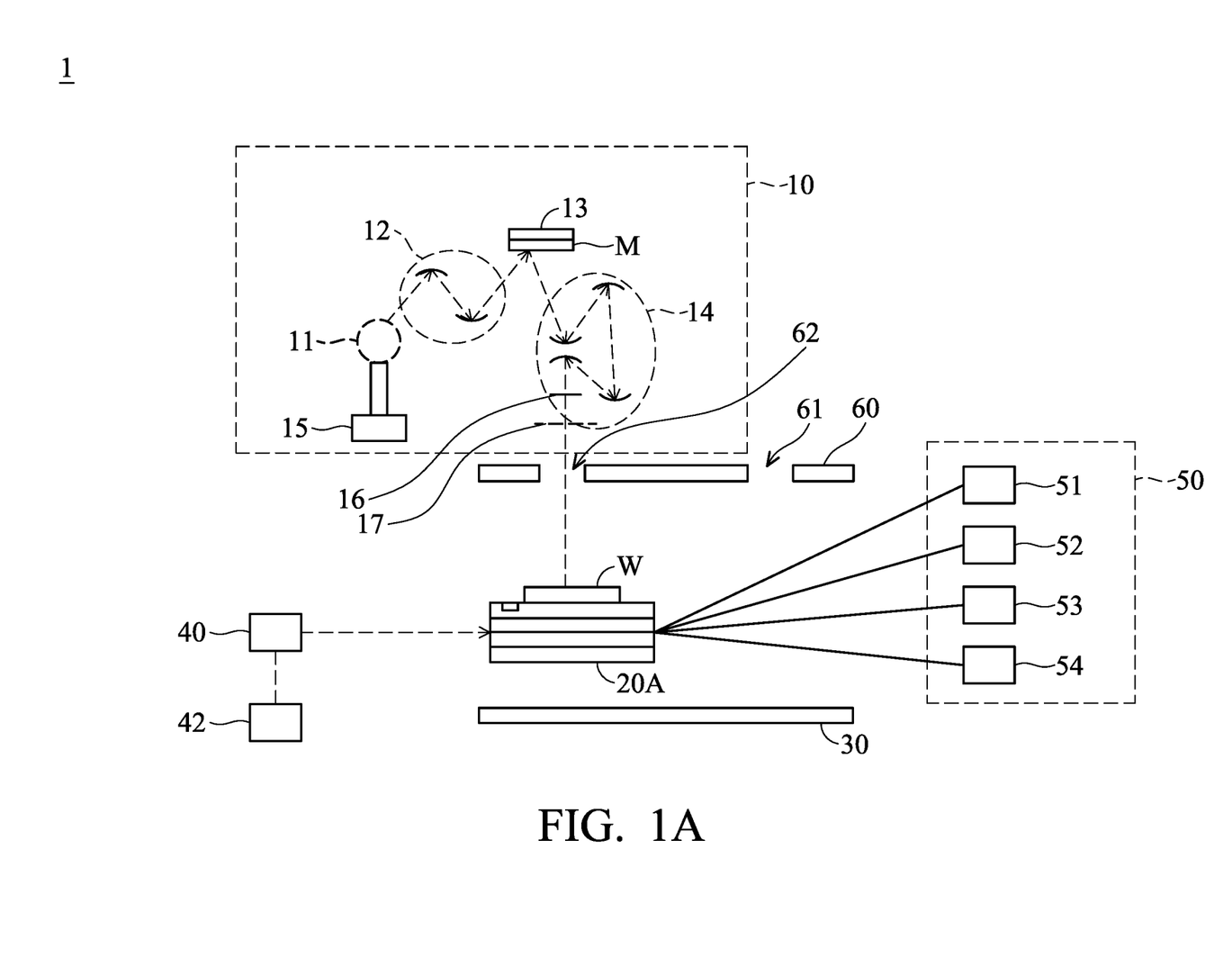
FIG. 1A is a schematic view of a semiconductor substrate processing system, in accordance with some embodiments.

FIG. 1A is a schematic view of a semiconductor substrate processing system 1, in accordance with some embodiments. In some embodiments, the semiconductor substrate processing system 1 includes a light source 10, a semiconductor substrate stage 20A, a magnetic plate 30, a signal source 40, a controller 42, a supply module 50, and a heat shield 60. The elements of the semiconductor substrate processing system 1 can be added or omitted, and the disclosure should not be limited by the embodiments.

In some embodiments, the semiconductor substrate processing system 1 is a lithography system. The lithography system may also be generically referred to as a scanner that is operable to perform lithography exposing processes with respective radiation source and exposure mode. In some embodiments, the semiconductor substrate processing system 1 is an EUV lithography system designed to expose a resist layer by EUV light (for illustration, the semiconductor substrate processing system 1 is also referred to as an EUV lithography system 1). The resist layer is a suitable material sensitive to EUV light. The light source 10 of the EUV lithography system 1 employs the radiation source 11 to generate EUV light, such as EUV light having a wavelength ranging between about 1 nm and about 100 nm. In one particular example, the radiation source 11 generates EUV light with a wavelength centered at about 13.5 nm. Accordingly, the radiation source 11 is also referred to as a EUV radiation source 11. In some embodiments, the EUV radiation source 11 utilizes a mechanism of laser-produced plasma (LPP) to generate the EUV radiation. In some embodiments, the radiation source 11 also includes a collector, which may be used to collect EUV light generated from the plasma source and to direct the EUV light toward imaging optics such as an illumination module 12 described later.

The light source 10 of the EUV lithography system 1 also employs an illumination module 12. In various embodiments, the illumination module 12 includes various reflective optics, such as a single mirror or a mirror system having multiple mirrors, in order to direct light from the radiation source 11 onto a reticle M of the EUV lithography system 1, particularly to the reticle M secured on the reticle stage 13.

In some examples, the illumination module 12 may include a zone plate to improve the focus of the EUV light. In some embodiments, the illumination module 12 may be configured to shape the EUV light that passes through it into a particular pupil shape. Examples of pupil shapes include a dipole shape, a quadrapole shape, an annular shape, a single beam shape, a multiple beam shape, and combinations thereof. In some embodiments, the illumination module 12 is operable to configure the mirrors (i.e., of the illumination module 12) to provide the desired illumination to the reticle M. In one example, the mirrors of the illumination module 12 are configurable to reflect EUV light to different illumination positions. In some embodiments, a stage prior to the illumination module 12 may include other configurable mirrors that may be used to direct the EUV light to different illumination positions within the mirrors of the illumination module 12. In some embodiments, the illumination module 12 is configured to provide an on-axis illumination (ONI) to the reticle M. In some embodiments, the illumination module 12 is configured to provide an off-axis illumination (OAI) to the reticle M. It should be noted that the optics employed in the EUV lithography system 1, and in particular the optics used for the illumination module 12 and the projection optics module 14, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

The reticle stage 13 is configured to secure the reticle M. In some embodiments, since the EUV lithography system 1 may be housed in, and thus operate within, a high-vacuum environment, the reticle stage 13 includes an electrostatic chuck (e-chuck) to secure the reticle M. This is because gas molecules absorb EUV light and the lithography system used for EUV lithography patterning is maintained in a vacuum environment to avoid EUV intensity loss. In the present disclosure, the terms mask, photomask, and reticle are used interchangeably.

In some embodiments, the reticle M is a reflective mask. One exemplary structure of the reticle M includes a substrate made of a suitable material, such as a low thermal expansion material (LTEM) or fused quartz. In various examples, the LTEM includes $TiO_2$ doped $SiO_2$, or another suitable material with low thermal expansion. The reticle M includes reflective multiple layers (ML) deposited on the substrate. For example, the ML may include a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The reticle M may further include a capping layer, such as ruthenium (Ru), disposed on the ML for protection. The reticle M further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

As shown in FIG. 1A, in the EUV lithography system 1, the reflective reticle M is held by the reticle stage 13 so that the patterned surface of the reticle M faces downward and the chucked surface of the reticle M (which is opposite the patterned surface) faces the reticle stage 13.

The light source 10 of the EUV lithography system 1 also includes a projection optics module (or projection optics box (POB)) 14 for imaging the pattern of the reticle M onto a semiconductor substrate W secured on the semiconductor substrate stage 20A of the EUV lithography system 1. In some embodiments, the projection optics module 14 has reflective optics for projecting the EUV light. The EUV light directed from the reticle M, which carries the image of the pattern defined on the reticle M, is collected by the projection optics module 14. The illumination module 12 and the projection optics module 14 are collectively referred to an optical module of the EUV lithography system 1.

In some embodiments, the EUV lithography system 1 also includes a pupil phase modulator 16 to modulate the optical phase of the EUV light directed from the reticle M in such a way that the light has a phase distribution along a projection pupil plane 17. In some embodiments, the pupil phase modulator 16 includes a mechanism to tune the reflective mirrors of the projection optics module 14 for phase modulation. For example, in some embodiments, the mirrors of the projection optics module 14 are configurable to reflect the EUV light through the pupil phase modulator 16, thereby modulating the phase of the light through the projection optics module 14. In some embodiments, the pupil phase modulator 16 utilizes a pupil filter placed on the projection pupil plane 17. By way of example, the pupil filter may be employed to filter out specific spatial frequency components of the EUV light reflected from the reticle M. In some embodiments, the pupil filter may serve as a phase pupil filter that modulates the phase distribution of the light directed through the projection optics module 14.

In some embodiments, the semiconductor substrate W is a semiconductor wafer made of silicon or other semiconductor materials. Alternatively or additionally, the semiconductor substrate W may include other elementary semiconductor materials such as germanium (Ge). In some embodiments, the semiconductor substrate W is made of a compound semiconductor such as silicon carbide (SiC), gallium arsenic (GaAs), indium arsenide (InAs), or indium phosphide (InP). In some embodiments, the semiconductor substrate W is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor substrate W may be a silicon-on-insulator (SOI) or a germanium-on-insulator (GOI) substrate.

In addition, the semiconductor substrate W may have various device elements. Examples of device elements that are formed in the semiconductor substrate W include transistors (e.g., metal oxide semiconductor field effect transistors (MOSFET), complementary metal oxide semiconductor (CMOS) transistors, bipolar junction transistors (BJT), high voltage transistors, high-frequency transistors, p-passage and/or n-passage field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the semiconductor substrate W is coated with a resist layer sensitive to the EUV light. Various components of the EUV lithography system 40 including those described above are integrated together and are operable to perform the lithography process. In some embodiments, the resist layer may have stringent performance standards. For purposes of illustration, an EUV resist may be designed to provide at least around 22 nm resolution, at least around 2 nm line-width roughness (LWR), and with a sensitivity of at least around 15 mJ/cm$^2$.

In some embodiments, the magnetic plate 30 is disposed below the semiconductor substrate stage 20A. In some embodiments, a maglev layer is provided on the bottom of the semiconductor substrate stage 20A to interact with the magnetic field generated by the magnetic plate 30. A force is then generated to allow the semiconductor substrate stage 20A being moved above the magnetic plate 30 without in contact with the magnetic plate 30.

In some embodiments, the controller 42 may provide control signal to the signal source 40, and then the signal source 40 transfers the control signal to the semiconductor substrate stage 20A in a wireless manner (e.g. in wireless communication with a wireless receiver 24 of the semiconductor substrate stage 20A) to control the position of the semiconductor substrate stage 20A relative to the magnetic plate 30. Therefore, no cable for transferring control signal needs to be connected to the semiconductor substrate stage 20A, and the amount of particles generated by the cable when the semiconductor substrate stage 20A is moving may be reduced, thereby increasing the yield. In some embodiments, the signal source 40 may facilitate a network connection of the semiconductor substrate stage 20A with various devices that may communicate to the semiconductor substrate stage 20A. In some embodiments, the signal source 40 may facilitate a wireless connection, such as over a wireless local area network (WLAN) or a 5th generation (5G) network, by using a transmitter, receiver, and/or transceiver.

In some embodiments, the supply module 50 includes a power source 51, a water storage device 52, a hydrogen source 53, and an extreme clean dry air (XCDA) source 54. In some embodiments, the power source 51, the water storage device 52, the hydrogen source 53, and the extreme clean dry air source 54 may be connected to the semiconductor substrate stage 20A by cables. In some embodiments, the power source 51 is configured to provide energy to the semiconductor substrate stage 20A. In some embodiments, the water storage device 52 is configured to provide water to the semiconductor substrate stage 20A for heat dissipation. In some embodiments, the hydrogen source 53 is configured to provide hydrogen to the semiconductor substrate stage 20A for reducing contamination. In some embodiments, the extreme clean dry air source 54 is configured to provide gas to the semiconductor substrate stage 20A, so the semiconductor substrate W on the semiconductor substrate stage 20A may be detached easily with the aid of air.

In some embodiments, a heat shield 60 is provided between the light source 10 and the semiconductor substrate stage 20A to block the heat generated from the light source 10. In some embodiments, a first channel 61 and a second channel 62 are formed on the heat shield 60 to allow light generated by the light source 10 to reach the semiconductor substrate W. In some embodiments, the semiconductor substrate W is initially moved to a first position under the first channel 61 by the semiconductor substrate stage 20A so that a position sensor, for example, can check whether the semiconductor substrate W is in the right position on the semiconductor substrate stage 20A through the first channel 61. Afterwards, the semiconductor substrate W is moved to a second position under the second channel 62 by the semiconductor substrate stage 20A, and the light generated by the light source 10 may pass through the second channel 62 to reach the semiconductor substrate W.

Persons with ordinary skill in the art will understand that the EUV lithography system 1 may be also equipped with a plurality of pressure gauges, thickness monitor systems (quartz crystal monitor, spectroscopic ellipsometer, reflection high-energy electron diffraction detector (RHEED)), shutters, a rotational manipulator, viewports, and/or transfer ports, though these are not shown in the figure.

Figure 1B:
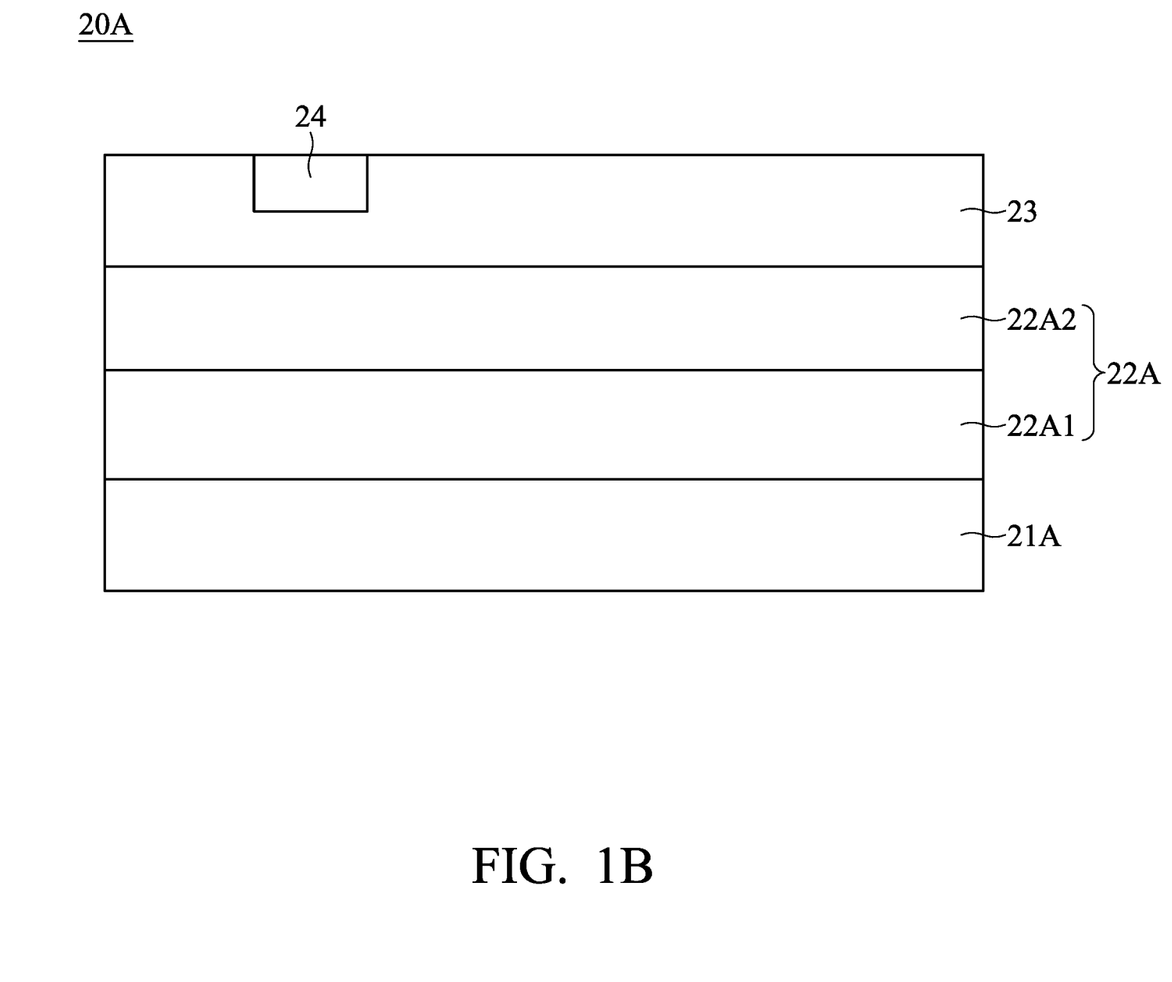
FIG. 1B is a schematic view of a semiconductor substrate stage, in accordance with some embodiments.

FIG. 1B is a schematic view of the semiconductor substrate stage 20A, in accordance with some embodiments. In some embodiments, the semiconductor substrate stage 20A mainly includes a base layer 21A, a magnetic shielding layer 22A, and a carrier layer 23. In some embodiments, a wireless receiver 24 is disposed on the carrier layer 23.

In some embodiments, the base layer 21A may be referred to as a maglev layer, which includes magnetic material such as iron, cobalt, nickel, a combination thereof, or an alloy thereof, etc. In some embodiments, the base layer 21A is disposed at the bottommost layer of the semiconductor substrate stage 20A and faces the magnetic plate 30. Therefore, a magnetic force is generated between the base layer 21A (the maglev layer) of the semiconductor substrate stage 20A and the magnetic plate 30 to allow the semiconductor substrate stage 20A be moved without in contact with the magnetic plate 30, so particles during the process may be reduced in some embodiments.

In some embodiments, the magnetic shielding layer 22A is disposed between the base layer 21A and the carrier layer 23 to shield the magnetic field generated by the base layer 21A for preventing the wireless receiver 24 from being affected by the base layer 21A or the magnetic plate 30, to increase the accuracy of the received signal. In some embodiments, the magnetic shielding layer 22A includes an insulating layer 22A1 and a metal layer 22A2. In some embodiments, the insulating layer 22A1 is disposed on the base layer 21A. For example, the bottom surface of the insulating layer 22A1 may be in contact with the top surface of the base layer 21A. In some embodiments, the insulating layer 22A1 is disposed between the metal layer 22A2 and the base layer 21A. In some embodiments, the metal layer 22A2 is disposed on the insulating layer 22A1 and is in contact with the bottom surface of the carrier layer 23 and the top surface of the insulating layer 22A1. In some embodiments, the insulating layer 22A1 includes insulating material, and is used for electrically isolating the metal layer 22A2 and the base layer 21A to prevent short circuits.

In some embodiments, the metal layer 22A2 includes metal, such as Cu, Ag, Al, other non-magnetic metal, or an alloy thereof, etc. In some embodiments, the metal layer 22A2 is used for shielding the magnetic field generated by the base layer 21A or the magnetic plate 30. In some embodiments, the thickness of the metal layer 22A2 should be high enough to avoid signal interference. For example, the thickness of the metal layer 22A2 is higher than the skin depth under the frequency of the control signal. The skin depth can be defined by the equation:

$$\delta = \sqrt{\frac{2\rho}{\omega\mu}}$$

δ is the skin depth, ρ is resistivity of the conductor, ω is angular frequency, and μ is permeability of the conductor. Some examples of the minimum thickness of the metal layer 22A2 of different material with regard to a 5G or Bluetooth signal are shown in Table 1.

TABLE 1

| | signal | |
|---|---|---|
| Material | 5G (3.3-3.6 GHz) | Bluetooth (2.4-2.5 GHz) |
| Cu | 1.13 μm | 1.33 μm |
| Ag | 1.11 μm | 1.31 μm |
| Al | 1.39 μm | 1.63 μm |

In some embodiments, the wireless receiver 24 is configured to receive the control signal (e.g. a microwave signal) from the signal source 40. In some embodiments, the wireless receiver 24 is electrically isolated from the signal source 40 and the controller 42 (or is not physically connected to the signal source 40 and the controller 42), and the control signal is used for controlling the movement of the semiconductor substrate stage 20A.

In various embodiments, the wireless receiver 24 may be disposed in a recess formed on the top surface of the carrier 23, and may provide data communications functionality in accordance a number of wireless protocols. Examples of wireless protocols may include various wireless local area network (WLAN) protocols. Other examples of wireless protocols may include various wireless wide area network (WWAN) protocols, such as GSM cellular radiotelephone system protocols with GPRS, CDMA cellular radiotelephone communication systems with 1×RTT, EDGE systems, EV-DO systems, EV-DV systems, HSDPA systems, and so forth. Further examples of wireless protocols may include wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may include near-field communication techniques and protocols, such as electromagnetic induction (EMI) techniques. An example of EMI techniques may include passive or active radio-frequency identification (RFID) protocols and devices. Other suitable protocols may include Ultra Wide Band (UWB), Digital Office (DO), Digital Home, Trusted Platform Module (TPM), ZigBee, and so forth.

Figure 2A:
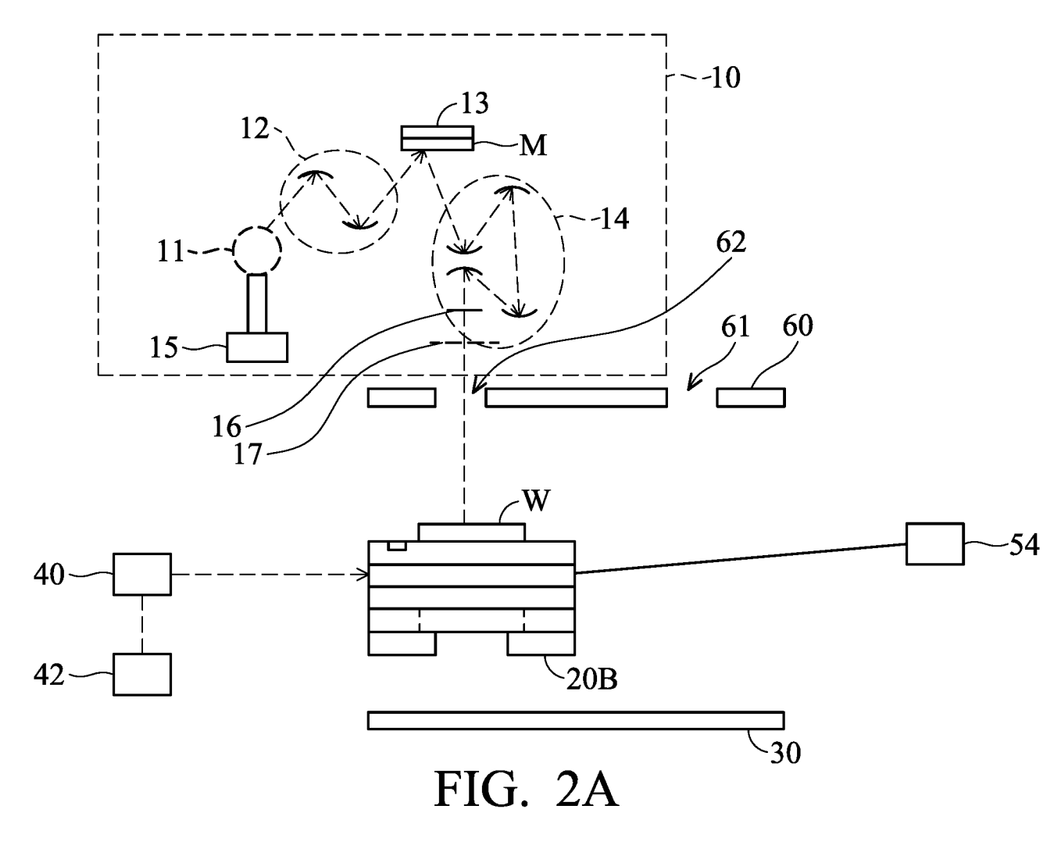
FIG. 2A is a schematic view of a semiconductor substrate processing system, in accordance with some embodiments.

FIG. 2A is a schematic view of a semiconductor substrate processing system 2, in accordance with some embodiments. In some embodiments, the semiconductor substrate processing system 2 includes a light source 10, a semiconductor substrate stage 20B, a magnetic plate 30, a signal source 40, a controller 42, an air source, and a heat shield 60. The elements of the semiconductor substrate processing system 2 can be added or omitted, and the disclosure should not be limited by the embodiments. Aforementioned similar or identical elements are not repeated therein.

Figure 2B:
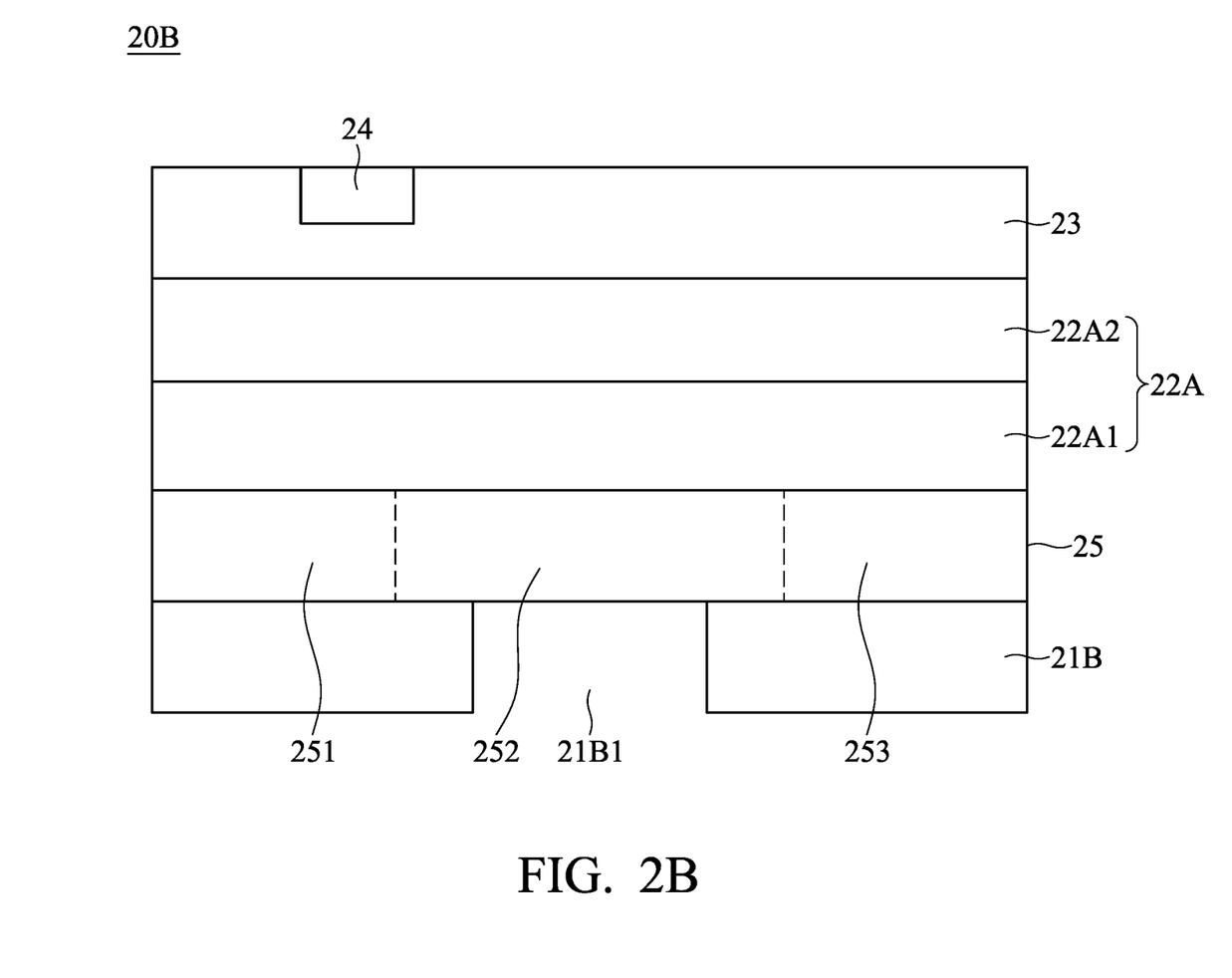
FIG. 2B is a schematic view of a semiconductor substrate stage, in accordance with some embodiments.

FIG. 2B is a schematic view of the semiconductor substrate stage 20B, in accordance with some embodiments. In some embodiments, the semiconductor substrate stage 20B mainly includes a base layer 21B, a magnetic shielding layer 22A, a carrier layer 23, and a storage layer 25. In some embodiments, a wireless receiver 24 is disposed on the carrier layer 23. Aforementioned similar or identical elements are not repeated therein.

In some embodiments, the base layer 21B is referrer to as a maglev layer. In some embodiments, the storage layer 25 is disposed between the base layer 21B and the magnetic shielding layer 22A. In some embodiments, the storage layer 25 includes an energy storage device 251, a water storage device 252, and a hydrogen source 253. In some embodiments, the energy storage device 251 may be a battery for provide energy for the semiconductor substrate stage 20B to operate. For example, the energy storage device 251 may be electrically connected to the wireless receiver 24. In some embodiments, the water storage device 252 may be a water tank to store water for cooling the semiconductor substrate stage 20B. In some embodiments, the hydrogen source 253 may be a hydrogen gas cylinder to store hydrogen. In other words, the energy storage device 251, the water storage device 252, and the hydrogen source 253 are moved with the semiconductor substrate W. Therefore, number of the cable connected to the semiconductor substrate stage 20B may be reduced to prevent particle from occurring during the process. In some embodiments, the energy storage device 251, the water storage device 252, and the hydrogen source 253 are arranged in a horizontal direction that is parallel to the top surface of the carrier layer 23.

In some embodiments, a channel 21B1 is formed on the base layer 21B, and a portion of the storage layer 25 is exposed from the channel 21B1. In some embodiments, the channel 21B1 is configured to allow the energy storage device 251, the water storage device 252, and the hydrogen source 253 being supplemented. For example, a cable (not shown) may be connected to the energy storage device 251 through the channel 21B1 when the semiconductor substrate stage 20B moves to a recharge station. In some embodiments, the energy storage device 251 may be recharged wirelessly through the channel 21B1. In some embodiments, water and hydrogen may be supplemented to the water storage device 252 and the hydrogen source 253 through the channel 21B1, respectively.

Figure 3A:
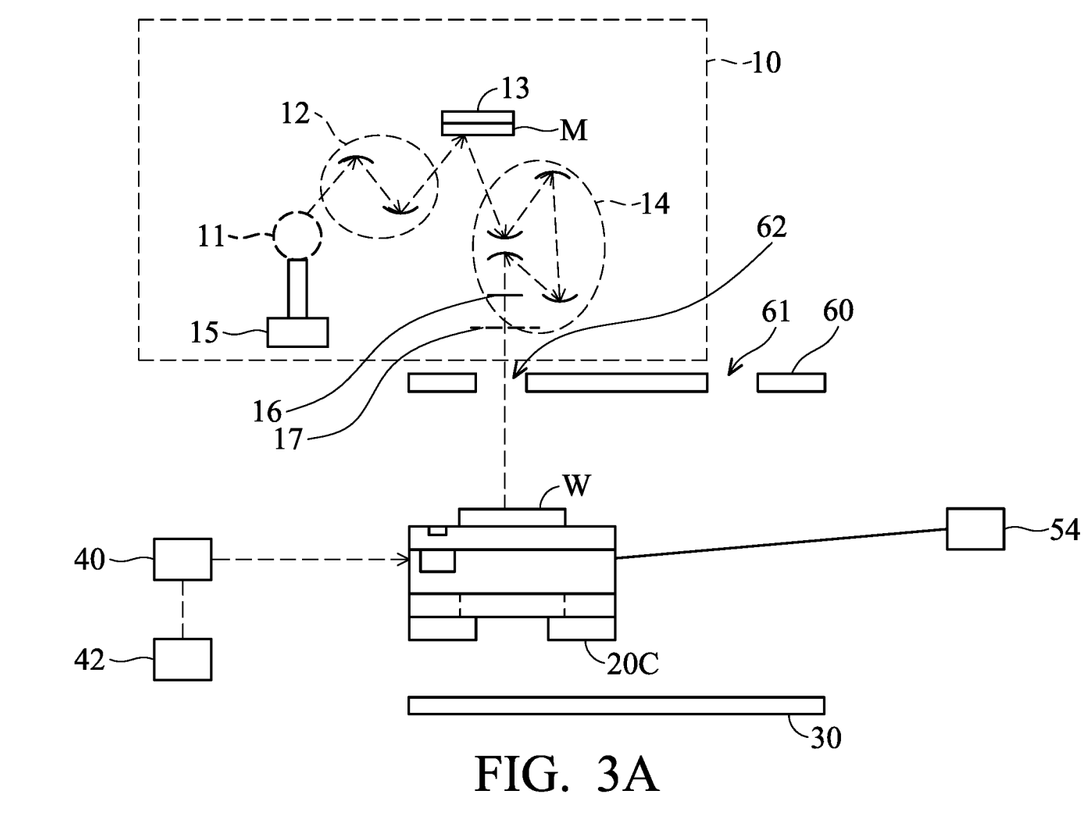
FIG. 3A is a schematic view of a semiconductor substrate processing system, in accordance with some embodiments.

FIG. 3A is a schematic view of a semiconductor substrate processing system 3, in accordance with some embodiments. In some embodiments, the semiconductor substrate processing system 3 includes a light source 10, a semiconductor substrate stage 20C, a magnetic plate 30, a signal source 40, a controller 42, an air source, and a heat shield 60. The elements of the semiconductor substrate processing system 3 can be added or omitted, and the disclosure should not be limited by the embodiments. Aforementioned similar or identical elements are not repeated therein.

Figure 3B:
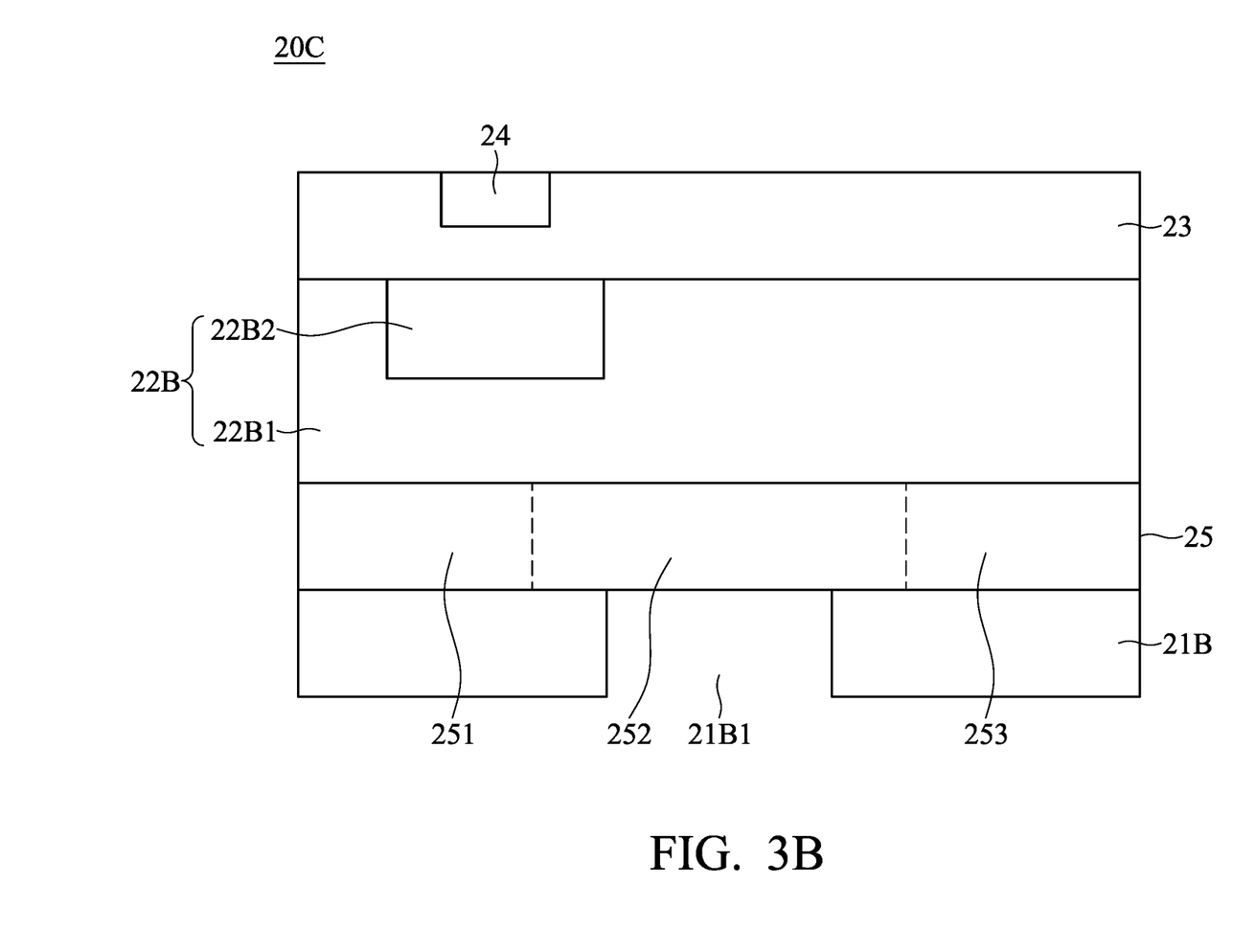
FIG. 3B is a schematic view of a semiconductor substrate stage, in accordance with some embodiments.

FIG. 3B is a schematic view of the semiconductor substrate stage 20C, in accordance with some embodiments. In some embodiments, the semiconductor substrate stage 20C mainly includes a base layer 21B, a magnetic shielding layer 22B, a carrier layer 23, and a storage layer 25. In some embodiments, a wireless receiver 24 is disposed on the carrier layer 23. Aforementioned similar or identical elements are not repeated therein.

In some embodiments, the magnetic shielding layer 22B includes an insulating layer 22B1 and a metal layer 22B2. In some embodiments, the insulating layer 22B1 and the metal layer 22B2 have different widths. For example, the side surfaces and the bottom surface of the metal layer 22B2 may be covered by the insulating layer 22B1, and the width of the insulating layer 22B1 may be greater than the width of the metal layer 22B2 to reduce the size of the metal layer 22B2 in some embodiments. In some embodiments, the metal layer 22B2 is enclosed by the insulating layer 22B1 and the carrier layer 23. In some embodiments, the wireless receiver 24 overlaps the metal layer 22B2 in a vertical direction that is perpendicular to the top surface of the carrier layer 23. Therefore, the wireless receiver 24 may be isolated from the magnetic field generated by the base layer 21B or the magnetic plate 30 under the wireless receiver 24.

Figure 4A:
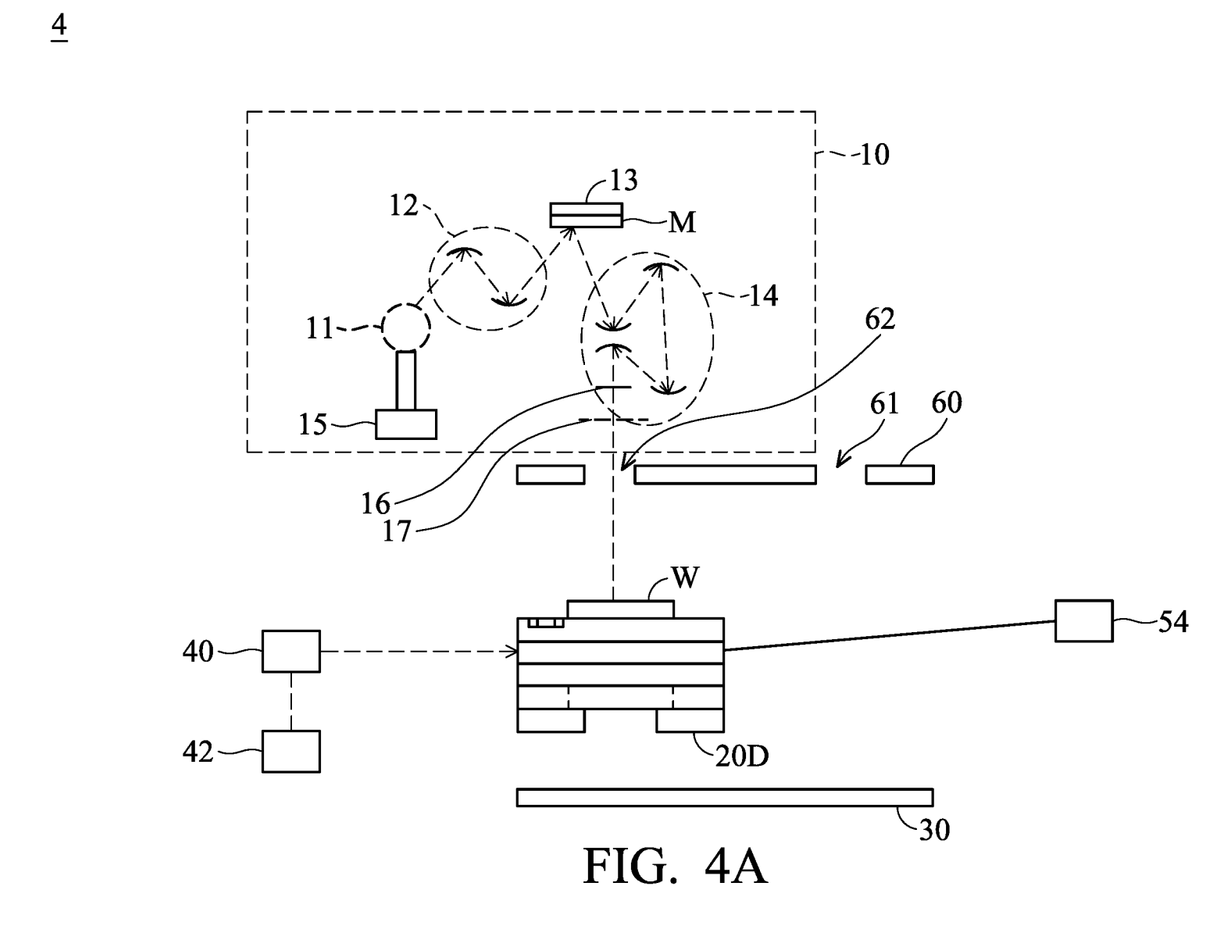
FIG. 4A is a schematic view of a semiconductor substrate processing system, in accordance with some embodiments.

FIG. 4A is a schematic view of a semiconductor substrate processing system 4, in accordance with some embodiments. In some embodiments, the semiconductor substrate processing system 4 includes a light source 10, a semiconductor substrate stage 20D, a magnetic plate 30, a signal source 40, a controller 42, an air source, and a heat shield 60. The elements of the semiconductor substrate processing system 4 can be added or omitted, and the disclosure should not be limited by the embodiments. Aforementioned similar or identical elements are not repeated therein.

Figure 4B:
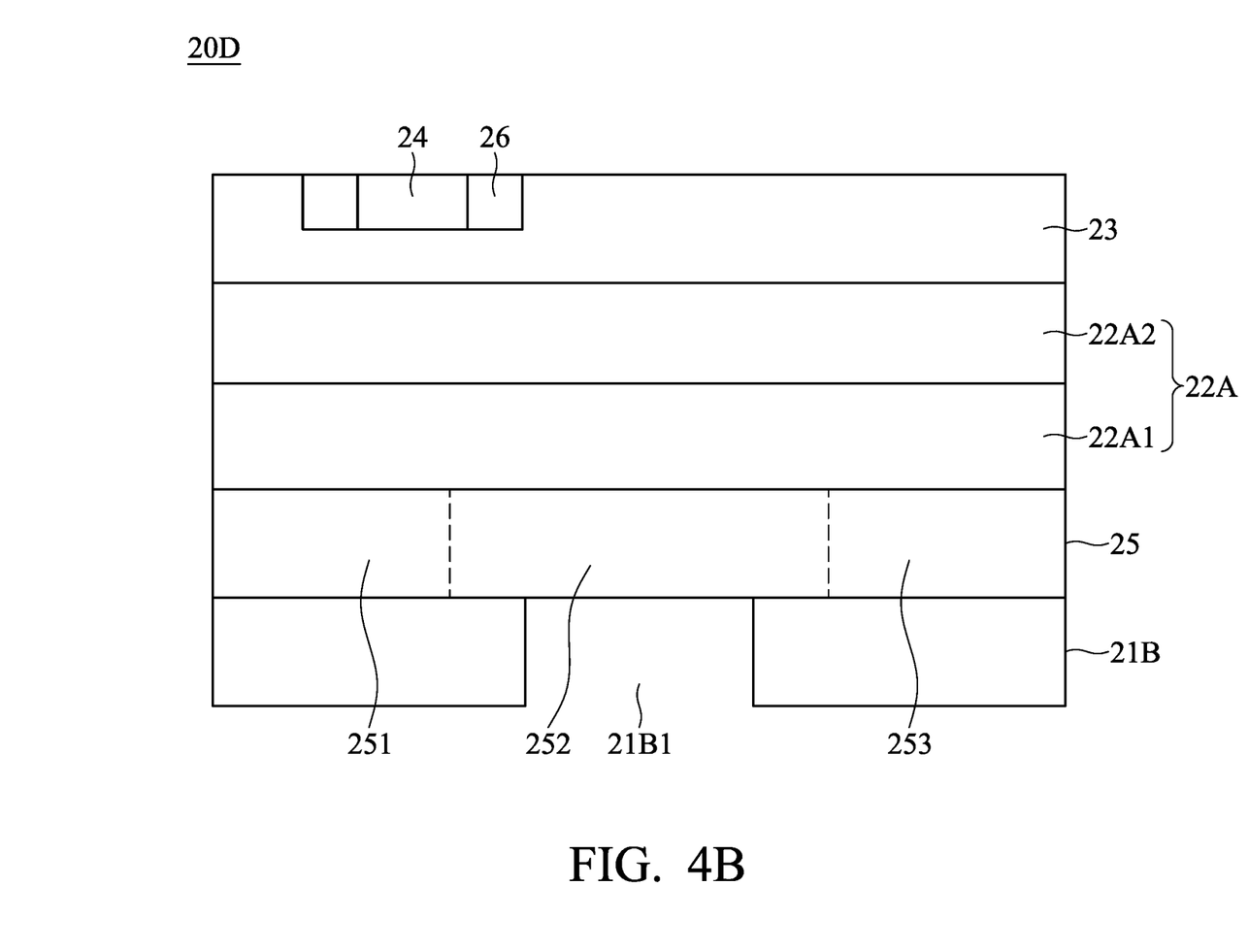
FIG. 4B is a schematic view of a semiconductor substrate stage, in accordance with some embodiments.

FIG. 4B is a schematic view of the semiconductor substrate stage 20D, in accordance with some embodiments. In some embodiments, the semiconductor substrate stage 20D mainly includes a base layer 21B, a magnetic shielding layer 22A, a carrier layer 23, and a storage layer 25. In some embodiments, a wireless receiver 24 is disposed on the carrier layer 23, and a magnetic shielding element 26 surrounds the wireless receiver 24. Aforementioned similar or identical elements are not repeated therein.

In some embodiments, the magnetic shielding element 26 is used for further shielding the magnetic field generated by the base layer 21B or the magnetic plate 30. In some embodiments, the wireless receiver 24 and the magnetic shielding element 26 are disposed in a recess formed on the top surface of the carrier layer 23, and the wireless receiver 24 is disposed in the magnetic shielding element 26. In some embodiments, the side surfaces of the wireless receiver 24 are in contact with the magnetic shielding element 26. In some embodiments, the top surfaces of the carrier layer 23, the wireless receiver 24, and the magnetic shielding element 26 are substantially coplanar. In some embodiments, the wireless receiver 24 and the magnetic shielding element 26 have substantially identical thicknesses to allow the semiconductor substrate stage 20D have a substantially planar top surface.

Figure 5A:
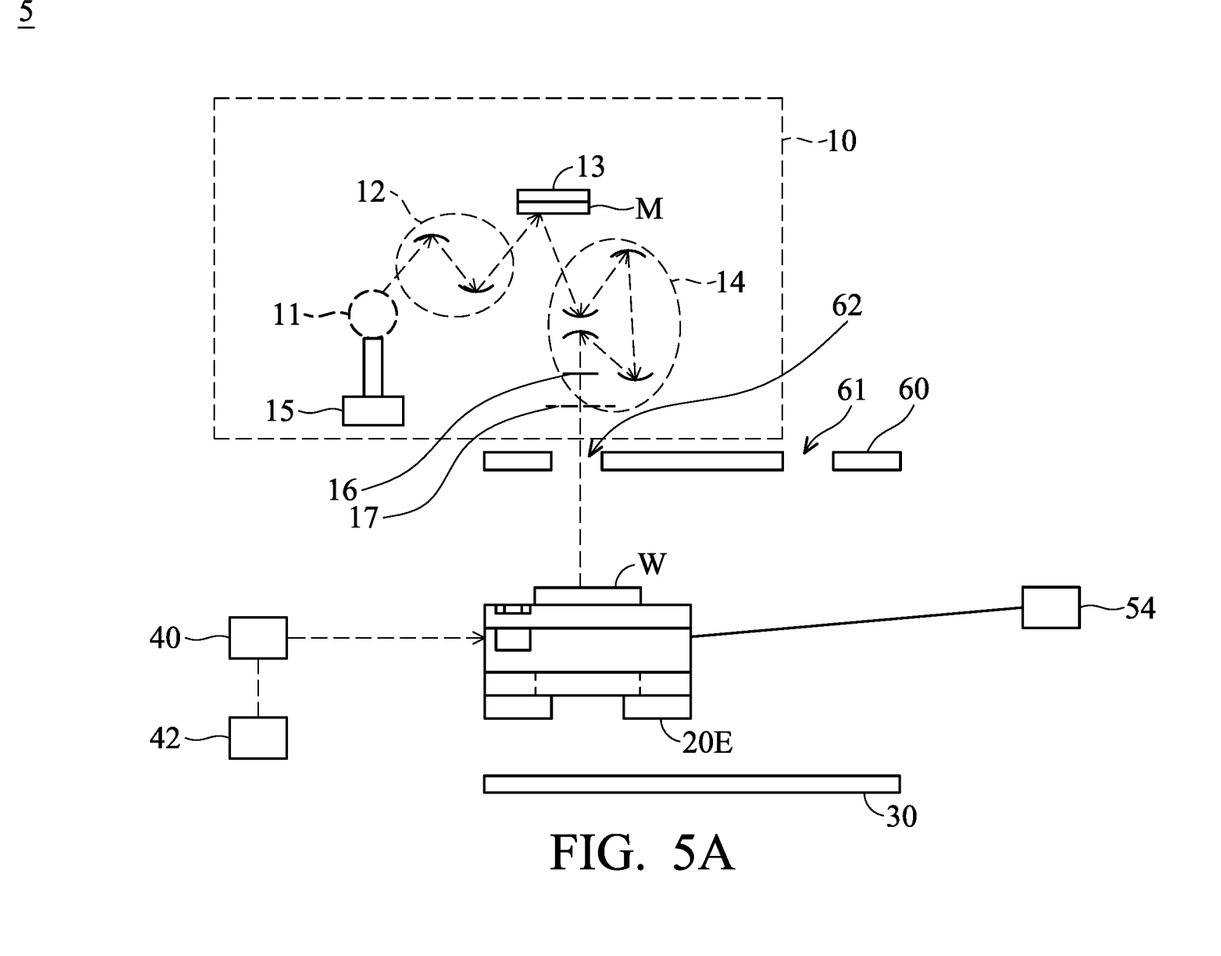
FIG. 5A is a schematic view of a semiconductor substrate processing system, in accordance with some embodiments.

FIG. 5A is a schematic view of a semiconductor substrate processing system 5, in accordance with some embodiments. In some embodiments, the semiconductor substrate processing system 5 includes a light source 10, a semiconductor substrate stage 20E, a magnetic plate 30, a signal source 40, a controller 42, an air source, and a heat shield 60. The elements of the semiconductor substrate processing system 4 can be added or omitted, and the disclosure should not be limited by the embodiments. Aforementioned similar or identical elements are not repeated therein.

Figure 5B:
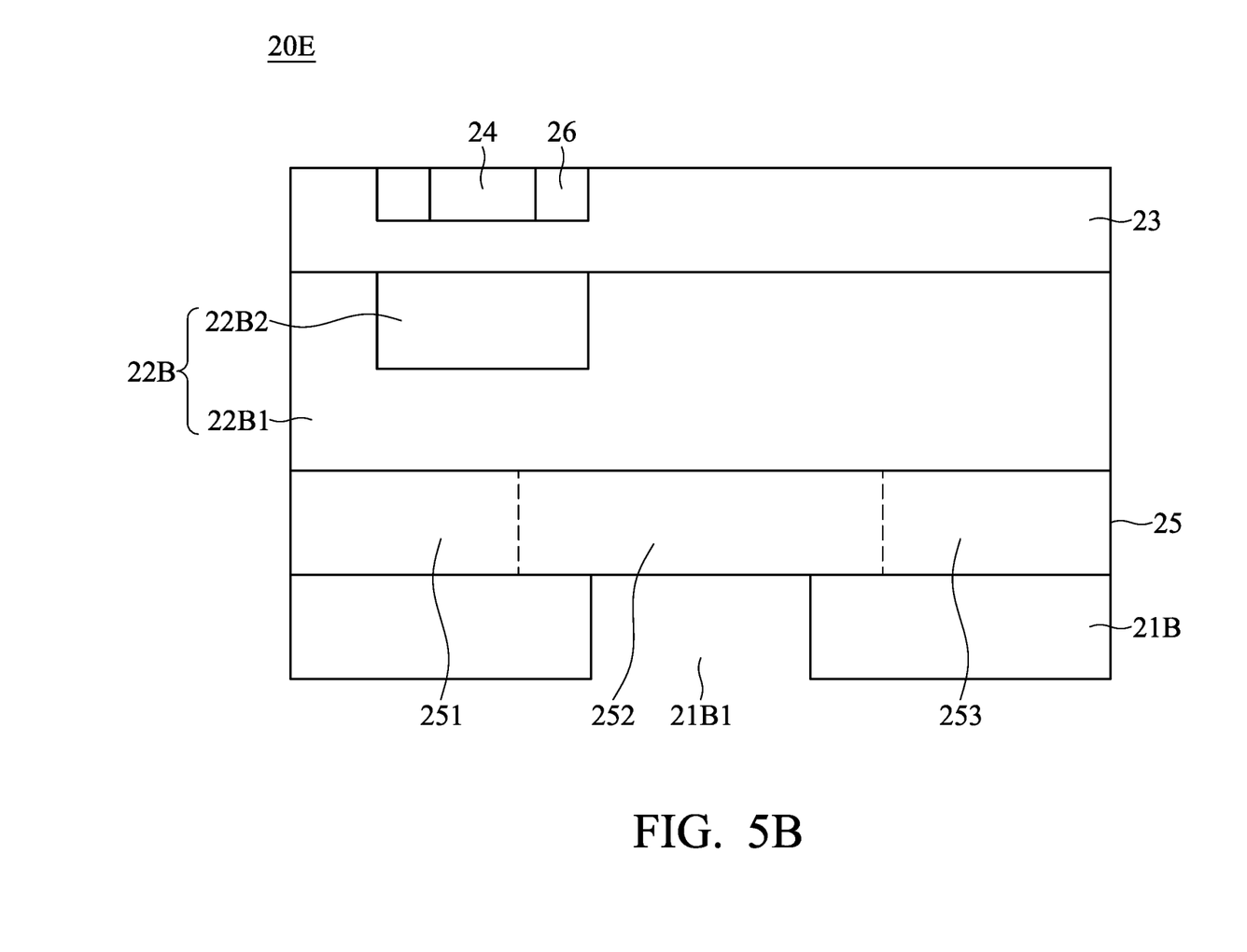
FIG. 5B is a schematic view of a semiconductor substrate stage, in accordance with some embodiments.

FIG. 5B is a schematic view of the semiconductor substrate stage 20E, in accordance with some embodiments. In some embodiments, the semiconductor substrate stage 20E mainly includes a base layer 21B, a magnetic shielding layer 22B, a carrier layer 23, and a storage layer 25. In some embodiments, a wireless receiver 24 is disposed on the carrier layer 23, and a magnetic shielding element 26 surrounds the wireless receiver 24. Aforementioned similar or identical elements are not repeated therein.

In some embodiments, the magnetic shielding layer 22B includes an insulating layer 22B1 and a metal layer 22B2. In some embodiments, the insulating layer 22B1 and the metal layer 22B2 have different widths. For example, the sidewalls of the metal layer 22B2 may be covered by the insulating layer 22B1, and the width of the insulating layer 22B1 may be greater than the width of the metal layer 22B2 in some embodiments. In some embodiments, the wireless receiver 24 overlaps the metal layer 22B2 in a vertical direction that is perpendicular to the top surface of the carrier layer 23. Therefore, the wireless receiver 24 may be isolated from the magnetic field generated by the base layer 21B or the magnetic plate 30 under the wireless receiver 24. In some embodiments, the metal layer 22B2 at least partially overlaps the magnetic shielding element 26 in the vertical direction to enhance the magnetic insulating effect.

In summary, a semiconductor substrate stage with a wireless receiver is provided in some embodiments of the present disclosure. By replacing cable for the control signal by the wireless receiver, number of cables of the semiconductor substrate stage may be reduced to decrease the chance of particle generated during the process, thereby increase the yield.

A semiconductor substrate stage for carrying a substrate is provided in some embodiments of the present disclosure. The semiconductor substrate stage includes a base layer, a magnetic shielding layer disposed on the base layer, a carrier layer disposed on the magnetic shielding layer, a receiver disposed on the carrier layer, a storage layer disposed between the base layer and the magnetic shielding layer, and a magnetic shielding element disposed on the carrier layer and surrounding the receiver.

A semiconductor substrate stage for carrying a substrate is provided in some embodiments of the present disclosure. The semiconductor substrate stage includes a base layer having a channel, a magnetic shielding layer disposed on the base layer, a carrier layer disposed on the magnetic shielding layer, a receiver disposed on the carrier layer, and a storage layer disposed between the base layer and the magnetic shielding layer. The receiver is configured to receive a signal that controls the movement of the semiconductor substrate stage. The storage layer includes a water storage device partially exposed from the channel.

A semiconductor substrate stage for carrying a substrate is provided in some embodiments of the present disclosure.

The semiconductor substrate stage includes a base layer, a magnetic shielding layer disposed on the base layer and including an insulating layer and a metal layer, a carrier layer disposed on the magnetic shielding layer, a receiver disposed in a recess formed on a top surface of the carrier layer, and a storage layer exposed from the channel. A channel is formed on the base layer. Sidewalls of the metal layer are in contact with the insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor substrate stage for carrying a substrate, comprising:
   a base layer;
   a magnetic shielding layer disposed on the base layer;
   a carrier layer disposed on the magnetic shielding layer;
   a receiver disposed on the carrier layer;
   a storage layer disposed between the base layer and the magnetic shielding layer; and
   a magnetic shielding element disposed on the carrier layer and surrounding the receiver.

2. The semiconductor substrate stage as claimed in claim 1, wherein a width of the metal layer is greater than the receiver.

3. The semiconductor substrate stage as claimed in claim 1, wherein the magnetic shielding element is in contact with a sidewall of the receiver.

4. The semiconductor substrate stage as claimed in claim 1, wherein the magnetic shielding element and the receiver have identical heights.

5. The semiconductor substrate stage as claimed in claim 1, wherein the magnetic shielding element and the receiver are in contact with an identical surface of the carrier layer.

6. The semiconductor substrate stage as claimed in claim 1, wherein the storage layer comprises hydrogen source in contact with the base layer.

7. The semiconductor substrate stage as claimed in claim 6, wherein the hydrogen source does not overlap the magnetic shielding element in a direction perpendicular to the base layer.

8. A semiconductor substrate stage for carrying a substrate, comprising:
   a base layer having a channel;
   a magnetic shielding layer disposed on the base layer;
   a carrier layer disposed on the magnetic shielding layer;
   a receiver disposed on the carrier layer, wherein the receiver is configured to receive a signal that controls the movement of the semiconductor substrate stage; and
   a storage layer disposed between the base layer and the magnetic shielding layer, comprising a water storage device partially exposed from the channel.

9. The semiconductor substrate stage as claimed in claim 8, wherein the storage layer further comprises an energy storage device disposed adjacent to the water storage device, wherein the energy storage device is not exposed from the channel.

10. The semiconductor substrate stage as claimed in claim 8, wherein the storage layer further comprises a hydrogen source disposed adjacent to the water storage device, wherein the hydrogen source is not exposed from the channel.

11. The semiconductor substrate stage as claimed in claim 8, wherein a width of the water storage device is greater than a width of the channel.

12. The semiconductor substrate stage as claimed in claim 8, wherein the magnetic shielding layer comprises:
    an insulating layer in contact with the storage layer; and
    a metal layer in contact with the carrier layer.

13. The semiconductor substrate stage as claimed in claim 12, wherein the insulating layer is in contact with the carrier layer.

14. The semiconductor substrate stage as claimed in claim 13, wherein the insulating layer is in contact with sidewalls of the metal layer.

15. A semiconductor substrate stage for carrying a substrate, comprising:
    a base layer, wherein a channel is formed on the base layer;
    a magnetic shielding layer disposed on the base layer, comprising an insulating layer and a metal layer, wherein sidewalls of the metal layer are in contact with the insulating layer;
    a carrier layer disposed on the magnetic shielding layer;
    a receiver disposed in a recess formed on a top surface of the carrier layer; and
    a storage layer exposed from the channel.

16. The semiconductor substrate stage as claimed in claim 15, wherein a width of the metal layer is greater than the receiver.

17. The semiconductor substrate stage as claimed in claim 15, wherein the metal layer overlaps the receiver in a vertical direction that is perpendicular to a top surface of the carrier layer.

18. The semiconductor substrate stage as claimed in claim 15, wherein a thickness of the metal layer is less than a thickness of the insulating layer.

19. The semiconductor substrate stage as claimed in claim 15, wherein the insulating layer and the metal layer are in contact with a bottom surface of the carrier layer, and the bottom surface faces the storage layer.

20. The semiconductor substrate stage as claimed in claim 15, further comprising a magnetic shielding element overlaps the metal layer in a vertical direction that is perpendicular to a top surface of the carrier layer.

* * * * *